(12) United States Patent
Teng et al.

(10) Patent No.: US 6,925,619 B2
(45) Date of Patent: Aug. 2, 2005

(54) IC CONDUCTOR CAPACITANCE ESTIMATION METHOD

(75) Inventors: Chin-Chi Teng, Sunnyvale, CA (US); Eddy Pramono, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 204 days.

(21) Appl. No.: 10/443,528

(22) Filed: May 21, 2003

(65) Prior Publication Data

US 2004/0237058 A1 Nov. 25, 2004

(51) Int. Cl.$^7$ .............................. G06F 17/50
(52) U.S. Cl. ............................. 716/5; 716/6
(58) Field of Search .................. 716/5, 6, 8–14

(56) References Cited

U.S. PATENT DOCUMENTS

| | | | | |
|---|---|---|---|---|
| 5,831,870 A | * | 11/1998 | Folta et al. ............... | 716/5 |
| 6,360,350 B1 | * | 3/2002 | Gabele et al. ............ | 716/1 |
| 6,618,846 B2 | * | 9/2003 | Cheng ...................... | 716/5 |
| 2003/0237063 A1 | * | 12/2003 | Kauth et al. .............. | 716/5 |
| 2004/0225975 A1 | * | 11/2004 | Pramono .................. | 716/5 |

* cited by examiner

Primary Examiner—Vuthe Siek
Assistant Examiner—Magid Y. Dimyan
(74) Attorney, Agent, or Firm—Rosenberg, Klein & Lee

(57) ABSTRACT

An RC extraction tool estimates capacitances of conductors residing along parallel grid lines on each of a set vertically stacked layers of insulating material of an IC based on data contained in a IC layout file describing positions of structures forming the IC. The tool initially processes the layout file to generate a separate database for each layer. Each database includes a separate table for each grid line on its corresponding layer, and each table includes a separate entry for each conductor residing along that grid line containing data indicating dimensions and a position of its corresponding conductor along that grid line. The tool processes the databases for each layer in ascending order to estimate capacitances between conductors on that layer and to generate set of data structures mapping the amount of conductor surface area on that layer to areas of layers above that layer, and to areas of layers below that layer in which conductors reside. The tool then processes the data structures to estimate capacitances between conductors on nearby layers.

26 Claims, 4 Drawing Sheets

IC CONDUCTOR CAPACITANCE ESTIMATION METHOD

BACKGROUND OF THE INVENTION

1. Field of the Invention

The present invention relates in general to computer-aided design tools for analyzing integrated circuit (IC) designs and in particular to a method and apparatus for estimating the capacitance of signal paths within an IC.

2. Description of Related Art

An IC designer typically generates a hardware description language (HDL) netlist describing an IC as a set of cells interconnected by signal paths (nets). Each cell produces one or more output signals in response to input signals with the input and output signals arriving and departing on the nets. The HDL netlist typically describes each cell only in terms of logical relationships between its input and output signals. After creating a netlist, the designer uses synthesis tools to convert the HDL netlist into a gate level netlist describing the cells in terms of logic gates or other structures that are to be incorporated into the IC to implement cell logic. The gate level netlist indirectly describes each cell by referring to an entry for that cell in a cell library, a database including a separate entry for each type of cell that can be incorporated into an IC. The cell library entry for each cell provides information about the cell including names of its input and output terminals, behavioral models of the cell, and a description of the cell layout.

After using a synthesis tool to generate a gate level netlist, the designer typically uses a placement and routing tool to generate an IC layout file indicating the position of each cell within the IC and indicating how the nets interconnecting the cells are to be formed. The nets include conductors formed on one or more layers of the IC and may include buffers for amplifying signals as they travel between cells.

Most digital ICs employ register transfer logic wherein each cell includes an output register, clocked by a leading or trailing edge of a clock signal, for storing one or more bits, each representing a state of one of the cell's output signals. The bits stored in that cell's output register control the state of the cell's output signals during the next clock cycle. Suppose a cell A stores a bit in its output register on the leading edge of a clock signal for controlling an output signal supplied through a net as an input signal to another cell B. Suppose also that cell B is to store a bit in its output register on the leading edge of the clock signal that is a function of the state of its input signal from cell A. Then after an edge of the clock signal changes a state of a bit stored in the output register of cell A, a cell A output signal edge must travel via a net to the cell B input, and cell B must process that signal edge and change the state of a bit supplied to its output register before the next leading edge of the clock signal.

For the IC to operate properly, the total signal path delay between the output register of cell A and the output register of cell B must be no longer than one clock signal cycle. Since the cell library will typically indicate the amount of time cell B requires to respond to a state change in its input signal (the cell's delay), a timing analysis tool can determine that net connecting cell A to cell B must have a path delay no longer than the difference between one clock signal cycle and the cell's delay. A designer establishes a timing budget indicating the maximum allowable delay through seconds of any time constrained signal path, and after using a placement and routing tool to generate an IC layout file, a designer will employ a timing analysis tool to check the layout to determine whether timing constraints on all signal paths have been satisfied.

In a typical IC, the nets are formed in part by conductors residing on layers of insulating material above the semiconductor substrate and by conductive vias passing vertically through the insulation layers for interconnecting conductors on different layers to one another and to transistors or other structures formed in the substrate. A net may also include buffers cells formed in the substrate. The path delay between any two terminals of IC devices connected though a net is therefore the sum of delays through the conductors, vias and buffers that conveying signals between those two terminals.

For a timing analysis tool to determine whether a signal path satisfies a timing constraint, it is necessary to be able to accurately estimate the path delay through each portion of the signal path. The path delay through a conductor forming a part of a signal path is largely a function of its shunt capacitance and its series resistance. As a signal edge propagates along the conductor, it has to charge or discharge the shunt capacitance it encounters before it can continue onward, and the time it requires to do that is a function of the magnitudes of the conductor's shunt capacitance and series resistance. Since the effects on path delay of conductor inductance is typically small, the conductor's inductance is usually ignored. Therefore to enable a timing analysis tool to estimate path delays through signal paths within an IC, a designer will first employ a resistance/capacitance (RC) extraction tool to estimate the resistance and capacitance of the conductors forming parts of those signal paths. The designer will then employ a timing analysis tool to estimate the path delay though each signal path as a function of the resistance and capacitance of conductors and of other component parts of the signal path.

A typical P&R tool generates an IC layout in the form of a data file which, among other things, specifies dimensions of each conductor forming a part of a net. The resistance per unit length of a conductor is a function of its cross-sectional area and the resistivity of the material forming the conductor. An RC capacitance tool searches through the IC layout file to locate the description of each conductor, ascertains the dimensions of the conductor from it description, and then estimates the conductor's resistance based on its dimensions.

The notion of "capacitance" relates to the amount of charge two conductors can store in an electric field between them when they are at different voltages, and the capacitance between any two conductors is a function of the size, shape and relative position and orientation of the two conductors and of the dielectric constant of the insulating material in which the field resides. The capacitance of any conductor of an IC is the sum of the capacitance between that conductor and every other conductor everywhere. However since the capacitance between two widely separated conductors is very small, an RC extraction tool can accurately estimate the capacitance of any conductor in an IC as the sum of the capacitances between that conductor and only its nearest neighbor conductors. The contributions to a conductor's capacitance from more distant conductors are ignored as being insignificant.

Since the capacitance of a conductor in an IC is a function not only of that conductor's dimensions, but also a function of the dimension and relative positioning and orientation of nearby conductors, estimating the capacitance of each conductor can be somewhat more complicated and time-consuming than estimating its resistance. A typical prior art RC extraction tool searches an IC layout file to locate a reference to a conductor and determine its dimensions and position in the layout. The RC extraction tool then searches the IC layout file again to determine the dimensions and relative position of every other conductor sufficiently close to that conductor to substantially influence its capacitance. The tool then computes the capacitance between that conductor and those nearby conductors. Thus a conventional RC extraction tool may have to search the IC layout file once for each conductor in the IC to find all conductors near it. Searching an IC layout file can be time-consuming for a computer programmed to function as an RC extraction tool particularly when the file is too large to reside wholly in the computer's random access memory (RAM). In that case the computer will have to access a hard disk containing the file many times to read successive portions of the file into RAM and separately search each portion of the file. Since disk accesses are time-consuming, much of the time a typical RC extraction tool needs to estimate conductor capacitance can be spent reading data from a hard disk.

What is needed is a method for accurate estimating capacitances of conductors in an IC layout that substantially reduces the number times an RC extraction tool must access a hard disk when the layout file is too large to reside wholly in RAM.

BRIEF SUMMARY OF THE INVENTION

An RC extraction tool in accordance with one embodiment of the invention estimates capacitances of conductors residing along parallel grid lines on each of a set vertically stacked layers of an IC based on data contained in an IC layout file describing each layer. The tool initially processes the layout file to generate a separate database for each layer, where each database includes a separate table for each grid line on its corresponding layer. The table corresponding to each grid line includes a separate entry for each conductor residing along that grid line, and that entry contains data indicating the dimensions and the position of its corresponding conductor along that grid line. The tool processes each database corresponding to each layer in the order in which the corresponding layers are stacked in the IC to determine the capacitance of each conductor. In doing so the tool need maintain only a few tables of one database in memory at any given time, and it need not load any table into memory more than once.

When it processes the tables of a database corresponding to each particular layer, the RC extraction tool estimates "horizontal" capacitances between conductors on that layer based on the data included in the database. The tool does not directly determine the "vertical" capacitance between each conductor on a given layer and conductors on layers above and below it at the time it processes the tables of the given layer's database, because to do so it needs information about positions of conductors residing not only on that layer but also on one or more layers above and below that layer. However as it processes the tables for a given layer L to estimate the horizontal capacitances of conductors on that layer, the RC extraction tool creates two sets of data structures M1 and M2 based on information contained in the tables for that memory. These data structures are later used as a basis for estimating vertical capacitances.

Each M1 data structure created while processing a database for a given layer (L) corresponds to a separate one of up to N nearest neighboring layers above layer L, where N is the maximum number of layers between any two conductors for which the vertical capacitance between them is considered significant. Each M1 data structure maps the amount of surface area of conductors residing on layer L to an array of rectangular areas of a corresponding layer J above layer L. The rectangular areas of arranged and sized relative to the spacing of grid lines on layers L and J so that only one grid line on layer J will pass through each rectangular area and so that only one grid line on layer L will pass under it. The grid lines on layers L and J may or may not be orthogonal to one another. The tool can generate the set of N data structures M1 for the N layers J (for J=L+1 through L+N) above layer L as it processes the database for layer L because it needs to know only the positions of conductors on layer L and need not know positions of conductors on any of the N layers J above layer.

Each data structure M2 of the second set corresponds to a separate one of up to N nearest neighboring layers I (for I=L−N though L−1) below the given layer L. Each M2 data structure maps the amount of surface area of conductors residing on layer L that overlaps a conductor residing on any rectangle area of its corresponding layer I below layer L. The rectangular areas of layer I are arranged and sized relative to the spacing of grid lines on layers I and L so that only one grid line on layer I will pass through each rectangular area and so that only one grid line on layer L will pass over it. The tool also generates the M2 data structures at the time it processes the database for layer L. The tool ascertains positions of the conductors on layer L from the layer L database, and ascertains the positions of conductors on each of the N layers I below layer L from M1 data structures mapping conductors on layers I to layer L it previously generated while processing the databases corresponding to those lower layers I. After the tool has processed the database for any layer L+N, previously generated M2 data structures relative to layer L contain sufficient information for the tool to estimate the vertical capacitance of every conductor on layer L.

The database tables are very small compared to the layout file and the RC extraction tool need not read any table of any database into memory more than once and need not concurrently store in memory more than a few tables of a single database in order to estimate horizontal and vertical capacitances of every conductor in the IC. The M1 and M2 data structures that the tool generates are also relatively small and only the data structures associated with the N layers above and below the current layer L need remain in memory concurrently.

An RC extraction tool employing the capacitance estimation method in accordance with the invention will access a disk drive storing a large layout file many times in order to create the database for each layer. But thereafter, given an adequate amount of memory, it need access the disk drive at most only once for each table of each database to load that table into memory. For large ICs having many layers and many conductors on each layer, the total number of disk accesses the tool needs to estimate the capacitance of each conductor based on the information contained in the database will normally be substantially less than if it were to estimate those capacitances based on data directly read out of the layout file without first converting the layout file into the database. This reduction in number of disk accesses during the capacitance estimation process more than compensates for the number of disk accesses needed to create the databases.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

Figure 1:
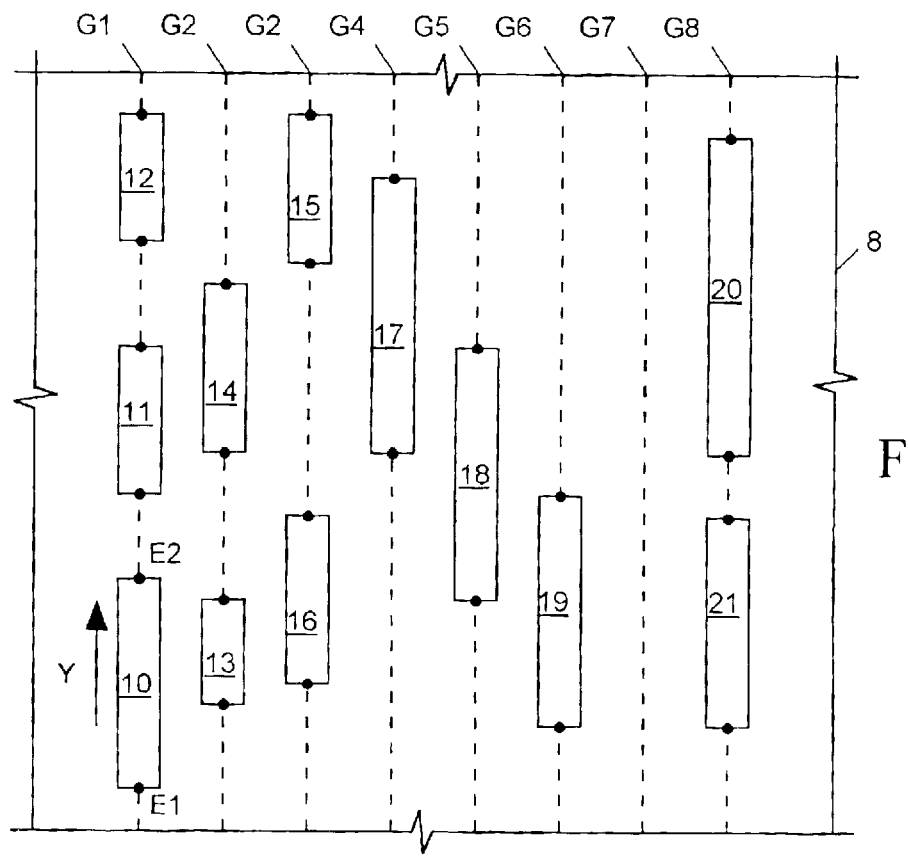
FIGS. 1 and 2 are simplified plan views of conductors formed on layers of an integrated circuit.

The present invention relates to software stored on computer-readable media for programming a conventional computer to estimate capacitances of conductors within an integrated circuit (IC) described by an IC layout file. Suitable computer-readable media for storing software include, but are not limited to, compact disks, floppy disks, hard disks, and random access or read only memory. The specification below describes at least one exemplary embodiment of the invention considered to be a best mode of practicing the invention. However since the intention may be practiced many ways, the invention is not necessarily limited to the exemplary embodiment described below.

Conductors residing on insulating layers above the IC's semiconductor substrate form parts of nets conveying signals between various cells of the IC. The nets also include vias interconnecting conductors residing on different layers to one another and to structures such as transistors formed in the underlying substrate. A computer-aided placement and routing tool can generate an IC layout file indicating where each cell instance forming an IC is to be placed and how it is to be formed, indicating how the conductors forming nets interconnecting the cells are to be arranged on each layer and indicating a position for each via.

Many signal paths within an IC are subject to timing constraints and IC designers create timing budgets allocating a separate portion of the timing constraint for each signal path to each of its parts, including conductors forming parts of a signal path. IC designers wanting to know whether path delays through various signal paths of an IC described by a layout file will be within their specified limits employ computer-aided timing analysis tools to estimate those path delays. The total delay through a signal path is the sum of delays through each of its parts, including delays through each conductor in that signal path. Since the path delay through a conductor is in part a function of its capacitance and its resistance, a timing analysis tool must know the resistance and capacitance of each conductor forming a part of signal path before it can estimate the delay through it. Designers therefore employ resistance/capacitance (RC) extraction tools to initially analyze an IC layout to determine the resistance and capacitance of each conductor within the IC so that a timing analysis tool will thereafter have the information it needs to determine path delays through the IC's internal conductors. The invention relates to a method an RC extraction tool can use to estimate the capacitance of each conductor in an IC based on information contained in an IC layout file.

The notion of "capacitance" is related to the ability of two conductors to store charge in an electric field arising between them when the conductors are at different potentials. The capacitance between any two conductors is a function of the size and shape of the two conductors, of the relative positions and orientations of the conductors, and of the dielectric constant of the insulating material separating them. The total capacitance of any conductor of an IC is therefore the sum of the capacitance between that conductor and every other conductor everywhere, but since the capacitance between any two conductors decreases with the distance between them, the RC extraction tool can accurately estimate the capacitance of any conductor within an IC as sum of capacitances between that conductor and only a relatively few nearest neighbor conductors on the same layer or on nearby layers of the IC. The relatively small contributions to a conductor's capacitance from more remote conductors can be safely ignored. Thus for the RC extraction tool to determine the capacitance of any conductor of interest within an IC, it must not only learn that conductor's dimensions, position and orientation within the IC, it must also learn the dimensions, position and orientation of every other conductor within the IC near enough to the conductor of interest to significantly add to its capacitance.

Figure 2:
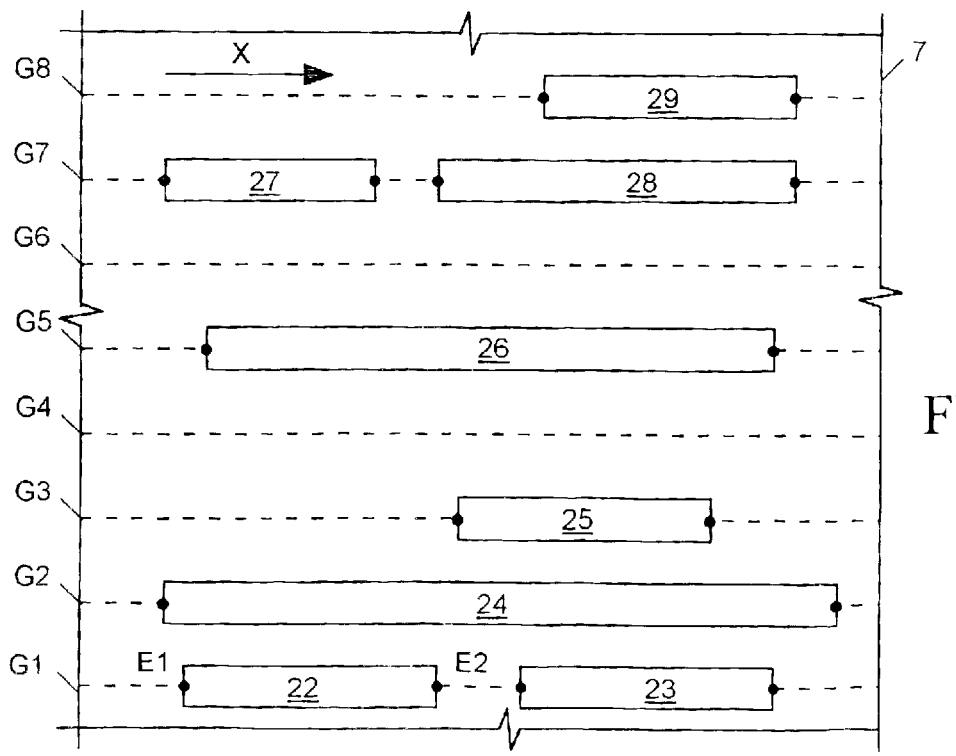
Figure 3:
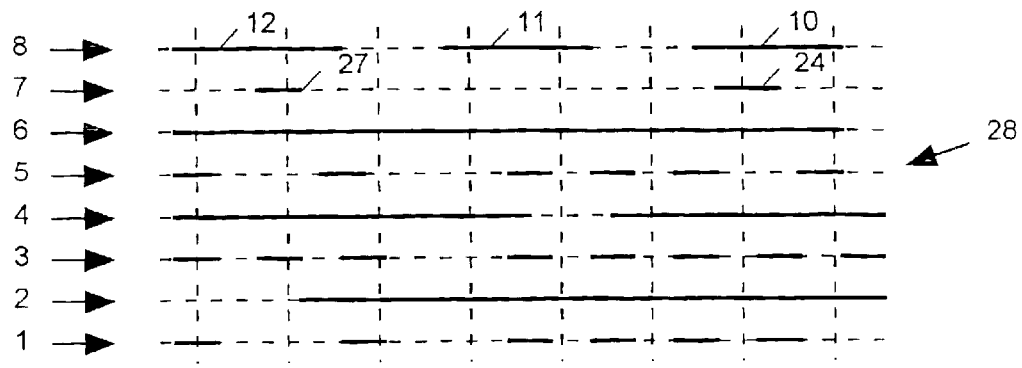
FIG. 3 is a simplified sectional elevation view of conductors formed on layers of an IC.

FIGS. 1–3 are partial plan and sectional elevation views of an IC having at least eight layers of conductors. FIG. 1 is a plan view of the conductor layer 8 of the IC, FIG. 2 is a plan view of a next lower conductor layer 7 of the IC including another set of conductors 22–29, and FIG. 3 is a sectional elevation view of the IC of FIGS. 1 and 2 showing layers 7 and 8 as well as six other lower level conductor layers 1–6. As shown in FIGS. 1 and 2, the conductors appear as rectangles in plan view formed along a set of imaginary parallel grid lines 1–8 on each layer. Although the conductors are shown in FIGS. 1 and 2 as being of uniform width, they need not be. As is typical for ICs, grid lines 1–8 on odd-numbered layers extend in a Y direction while grid lines on even-numbered layers extend in an X direction orthogonal to the Y direction. In the simple example of FIGS. 1–3, each layer has only eight similarly-spaced grid lines, however ICs typically have many more grid lines per layer and the number and spacing between grid lines need not be uniform from layer-to-layer.

To determine the capacitance of any conductor of interest, the RC extraction tool must first identify the nearby conductors that are sufficiently close to it to contribute substantially to its capacitance, estimate the capacitance between each such nearby conductor and the conductor of interest, and then sum the results. Consider, for example, conductor 24 on layer 7 depicted in FIG. 2. Much of its capacitance is due to the capacitance between conductor 24 and the following conductors:

1. conductors 22, 23 and 25 on adjacent grid lines of the same layer 7, 2. conductors 10, 13, 19 and 21 residing on next higher layer 8 (FIG. 1) that conductor 24 passes directly under, and 3. conductors on next lower layer 6 conductor 24 passes directly over.

However the capacitance between conductor 24 and other conductors in the IC also contributes to the total capacitance of conductor 24, but to a lesser extent because those other conductors are farther away from conductor 24. When an RC extraction tool knows beforehand that the capacitance between two conductors on different layers can be significant only when the two conductors are no more than some number N layers apart, then when estimating the capacitance of any conductor of interest, it is necessary for an RC extraction tool to look only for conductors that are vertically no more then N layers away from the conductor of interest. Similarly, if an RC extraction tool knows beforehand that the capacitance between two conductors on the same layer can be significant only when the two conductors are no more than M grid lines apart, then when estimating the capacitance of any conductor of interest, it is necessary for an RC extraction tool to look only for conductors on the same that are horizontally no more then M grid lines away from the conductor of interest. Thus an RC extraction tool can save time by computing capacitance only between conductors that are sufficiently close to one another in vertical or horizontal directions, and only when they conductors horizontally or vertically overlap the conductor of interest.

One difficulty with that approach is that an IC layout file is typically organized on a cell-by-cell and net-by-net basis rather than on a layer-by-layer basis so that information regarding the size and position of each conductor on some given layer L is dispersed throughout the layout file. This means that when computing the capacitance of any given conductor based on information contained in a layout file, an RC extraction tool would have to search the entire layout file to find all conductors that are sufficient close to and vertically or horizontally overlapping the conductor of interest. Since an IC may a large number of conductors, performing such a search of the layout file for each conductors can be time-consuming, particularly when the layout file it too large to reside wholly within the random access memory (RAM) of the computer programmed to act as an RC extraction tool. In such case, the computer might have to access the file on a hard disk a great many times in order to estimate the capacitance of every conductor.

The invention reduces the number of disk accesses an RC extraction tool must make in part by initially processing the layout file to produce a set of databases, each corresponding to a separate one of the layers. Each database includes a separate table corresponding to each grid line on the layer, and each table includes a separate entry corresponding to each conductor along the grid line. Each entry indicates the position of its conductor along the grid line and, when conductors are non-uniform width, each entry also indicates the conductor's width. The tool sorts the tables of each database so that they appear in the data base in the same order that their corresponding layers appear in the IC, and sorts the entries within each table so that they appear in the table in the same order their corresponding conductors appear along a grid line. Thereafter, when computing conductor capacitances, the RC extraction tool obtains the information it needs about conductor positions and widths from these databases rather than from the original layout file.

The RC extraction tool must perform a number of disk accesses to read the layout file and generate the databases, and must spend some time sorting the databases. But having created the databases, the tool can quickly estimate capacitances of all conductors because, due to the manner in which the databases have been sorted, it need make only a relatively few disk accesses to obtain the necessary data from the databases. For large ICs having many conductors, the time an RC extraction tool saves by accessing the databases rather than the IC layout file when calculating conductor capacitances greatly outweighs the time it spent generating the databases.

Figure 4:
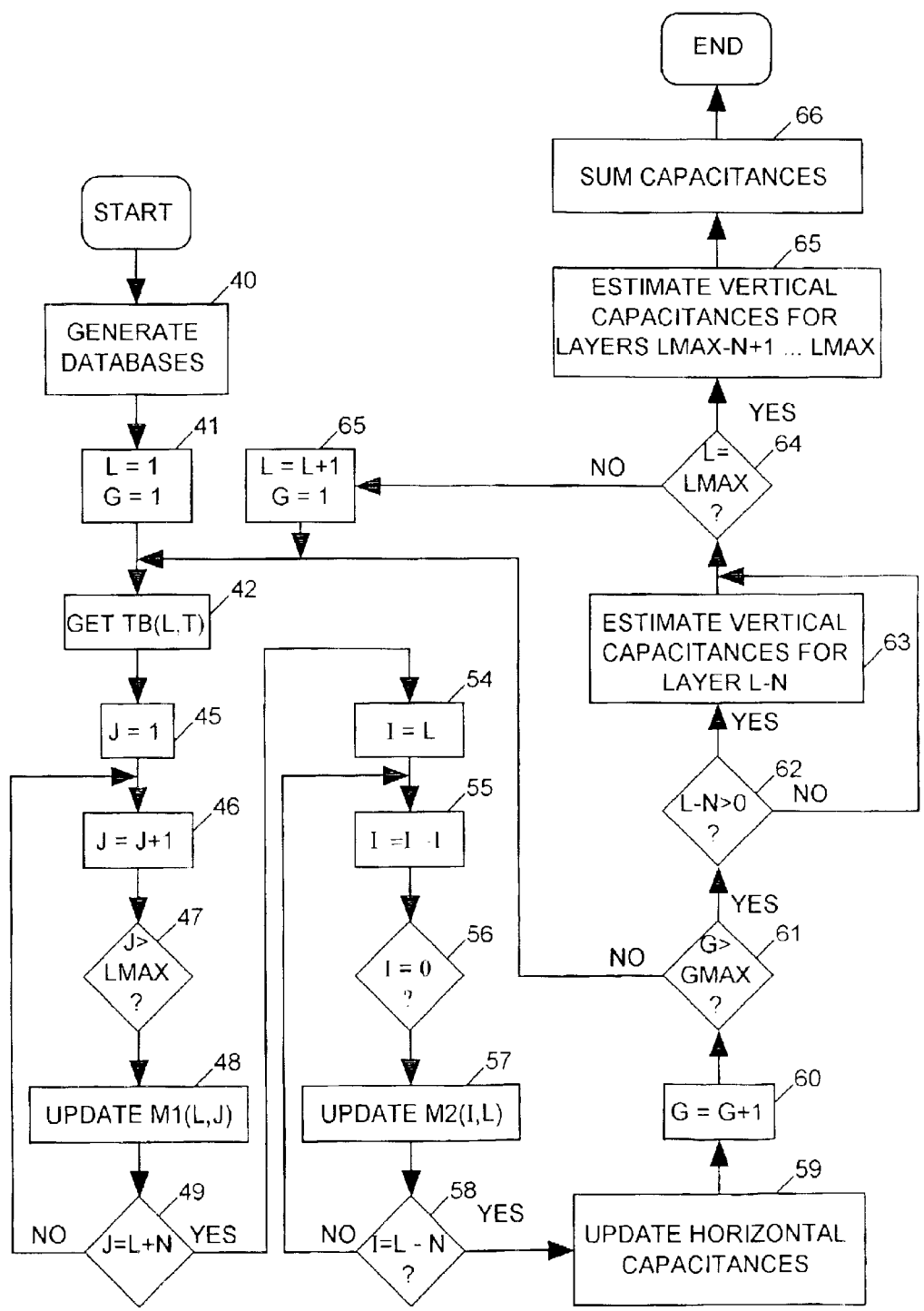
FIG. 4 depicts in flow chart diagram form an example method in accordance with the invention for computing capacitances of conductors residing on multiple layers of an IC.

FIG. 4 depicts an example algorithm in accordance with the invention that may be employed by and RC extraction tool for efficiently processing a large IC layout file to determine capacitances of conductors on the various layers of the IC. The algorithm assumes that the insulating layers of an IC on which conductors are formed are numbered in the order in which they are stacked from L=1 to LMAX where layer L=1 is the lowest insulating layer and L=LMAX is the highest layer. The layer chosen to be "lowest" insulating layer may be either the insulating layer nearest the semiconductor substrate (as would be the case when the IC is positioned with its substrate down) or may be the layer most distant from the substrate (as would be the case when the IC is positioned with its substrate up).

As illustrated in FIG. 4, the RC extraction tool initially (step 40) processes the large IC layout file to create a set of databases DB(L), one for each layer L=1 through LMAX. Each database DB(L) corresponds to the Lth layer of the IC and includes a separate table TB(L,G) for each grid line G on that layer ranging from 1 to GMAX, where GMAX is the maximum number of grid lines on layer L. The table for each grid line G includes an entry for each conductor, if any, formed along that grid line, the entry containing data indicating coordinates of that conductor's endpoints along the grid line and, when conductors may be of non-uniform width, indicating that conductor's width. The tool sorts the conductor entries within the table for each grid line in the order the conductors appear along the grid line. For example conductor 10 appears first in a table for grid line G=1 of layer L=8 (FIG. 1), and the entry for conductor 12 appears last. Conductor 22 appears first in the table for grid line G=1 of layer L=7 (FIG. 2) and conductor 23 appears second because that is the order in which they are positioned in the X direction along grid line 1.

After creating the database at step 40 the tool sets the layer L equal to 1 and sets the grid line number G equal 1 (step 41). The tool then processes the data in table TB(L,G) to do three things. First it generates a set of up to N data structures $M1^{(L,J)}(x,y)$, each mapping areas of conductors on grid line G of layer L to each layer J (if any) above layer L for values of J ranging from L+1 to L+N not exceeding LMAX. The value of N is suitably the largest value for which vertical capacitances between conductors on all layers more than N layers above layer L and conductors on layer L can be considered insignificant.

Figure 5:
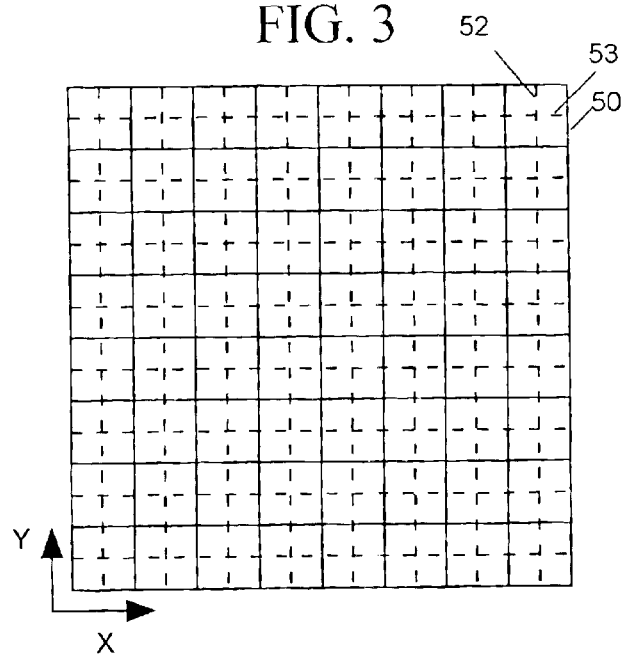
FIG. 5 is a plan view of an IC layer illustrating how the method of FIG. 4 treats the layer as being organized into an array of rectangular areas of grid overlap.

FIG. 5 is a plan view of a map of layer L organized into an array of rectangular areas 50, each containing a separate section of one grid line 52 on layer J overlapping a section of one grid line 53 of layer L. FIG. 5 assumes that grid lines on layers L and J are orthogonal as normally would be the case, for example when one layer is even-numbered and the other layer is odd-numbered. However the grid lines 52 and 53 in each area 50 may extend in the same direction when both layers are odd-numbered or even-numbered layers.

Figure 6:
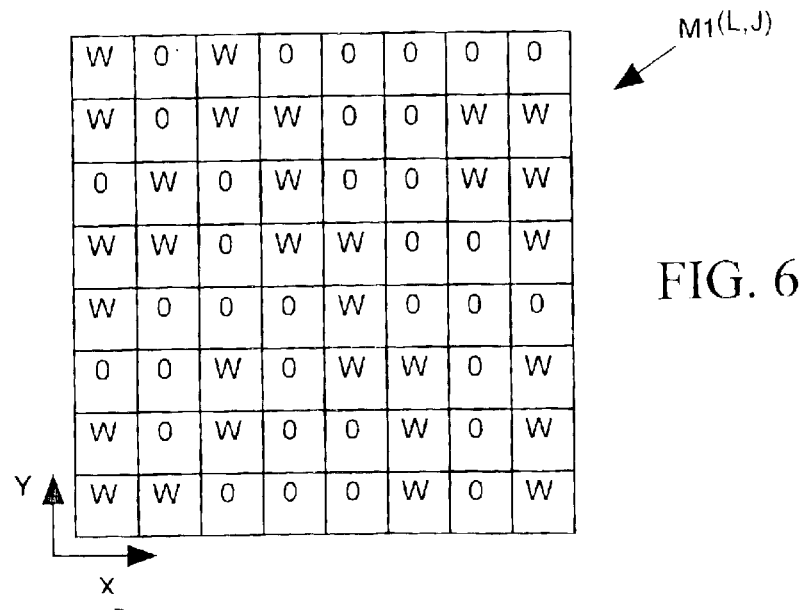
FIG. 6 graphically depicts an example data structure created by the method of FIG. 4.

FIG. 6 illustrates a data structure $M1^{(L,J)}(x,y)$, suitably a two-dimensional data array in which each value of the array corresponds to a separate one of the rectangle areas at coordinates (x,y) of layer J of FIG. 5 and includes data indicating an amount of surface area of conductors of layer L lie directly under the corresponding area 50 of layer J. As illustrated in FIG. 6, the value of $M1^{(L,J)}(x,y)$ for each area 50 is 0 when no conductors of layer L lie under that area 50 at coordinates (x,y) and of some non-zero value W when conductors of layer L do lie under that area 50. The data value W indicates the total horizontal area of all conductors on layer L lying under that particular area 50. Each database table TB(L,G) includes enough information for the tool to create the array $M1^{(L,J)}(x,y)$ for those areas 50 of each layer J residing above grid line G of layer L.

Thus, referring again to FIG. 4, after reading table TB(L, G) into memory, the tool sets J=L (step 45), increments J (step 46), determines whether J is greater than LMAX (step 47), and if not, processes the information in table TB(L,G) to determine values of data structure $M1^{(L,J)}(x,y)$ mapping the conductors along grid line G of layer L to areas of layer J residing above grid line G (step 48). If J has not yet reached L+N (step 49), steps 46–49 are repeated to map the conductors on grid line G of layer L to the next higher layer J. When the conductors on grid line G have been mapped to all layers L+1 through L+N (step 49) or when J has been made larger than LMAX (step 47), a next phase of the processing of table TB(L,G) begins at step 54.

During this next processing phase, the conductors along grid line G of layer L are mapped to layers I below layer L for all values of I from L−1 through L−N that are greater than 0. Each layer I is organized into an array of areas similar to areas 50 of FIG. 5, wherein each area 50 represents an area of layer I containing a section of a grid line of layer L overlapping a section of a grid line of layer I. A second data structure $M2^{(I,L)}(x,y)$ is created for which each data word corresponding to an area 50 at coordinates (x,y) indicates the total surface area of conductors of layer L residing above conductors on layer I residing in that area 50. Note there is a difference between arrays $M1^{(L,J)}(x,y)$ and $M2^{(I,L)}(x,y)$. While array $M1^{(L,J)}(x,y)$ maps areas of conductors of layer L onto areas 50 of layer J, array $M2^{(I,L)}(x,y)$ maps areas of overlap between conductors of layers L and I onto areas 50 of layer L. While it is possible for the tool to create array $M1^{(L,J)}(x,y)$ only from information contained in the table of database DB(L) because it indicates only positions of conductors on layer L relative to areas of layer J, it is not possible for the tool to create array $M2^{(I,L)}(x,y)$ only from the information in database DB(L) because it needs to know the positions of conductors on both layers I and L to create array $M2^{(I,L)}(x,y)$. Thus when the tool is processing a table TB(L,G) for a grid line on layer L, it computes values for the of arrays $M1^{(L,J)}(x,y)$ relative to the layers J above it based only on the data in TB(L,G). To create the data structures $M2^{(I,L)}(x,y)$ for layers I below layer L, the tool not only consults TB(L,G) to learn the positions of conductors on layer L, it also consults previously created arrays $M1^{(I,L)}(x, y)$ indicating positions conductors on each lower layer I relative to layer L. Thus, referring again to FIG. 5, after creating the $M1^{(L,J)}(x,y)$ arrays for all N layers above layer L, the tool sets I=L (step 54), decrements I (step 55), and if I is not equal to 0 (step 56), updates the $M2^{(I,L)}(x,y)$ array for layer I to set values of data indicating the amount of area of conductors along grid line G that overlap conductors in areas of layer I residing under grid line G (step 57). When I is not yet equal to L−N (step 58), steps 54–58 are repeated to create arrays $M2^{(I,L)}(x,y)$ for all values of I from L−1 through L−N for which I is greater than 0.

The next phase of the processing of table TB(L,G) occurs after step 58, if I=L−N, or after step 56 if I=0. Here (step 59) the tool increases its estimates of horizontal capacitances of conductors on layer L to account for capacitances of conductors on grid line G. The tool then increments G (step 60). If G does not yet exceed GMAX (step 61), the tool repeats steps 42–59 to generate the various $M1^{(L,J)}(x,y)$ and $M2^{(I,L)}(x,y)$ arrays related to conductors on the next grid line of layer L and to update the horizontal capacitance estimates for layer L to account for conductors along that next grid line. The process continues to loop through steps 45 through 61 until at step 61 G exceeds GMAX, indicating that all tables of database DB(L) have been processed.

As mentioned above, the "vertical capacitance" between any conductor on any layer L is estimated as the sum of the capacitance between that conductor any conductor on layer L+1 through L+N that overlaps it, and the capacitance between that conductor and any conductor it over laps on layers L−N through L−1. Thus upon having processed databases for all layers 1 through L, the tool calculates the vertical capacitances of conductors on layer L−N (if L−N is greater than 0) based on the data included in previously generated arrays $M2^{(L-N)}(x,y)$ for 1 all values of I from =L−2N through L for which I is greater than 0 and less than LMAX. Therefore when L−N>0 (step 62), the vertical capacitance of each conductor on layer L−N estimated (step 63). After step 63, or after step 62 when N is not greater than 0, if L is not equal to LMAX (step 64), L is incremented and G is set equal to 1 (step 65). Steps 42 through 64 are then repeated to process the tables of database DB(L) for the next higher layer. When all tables of all data bases have been processed, L will equal MAX at step 64. At that point the vertical capacitance for conductors on all layers up to LMAX−N will have been computed during successive passes through step 63. The tool then estimates the vertical capacitances for conductors of layers LMAX−N+1 through LMAX (step 65) and thereafter estimates the total capacitance for each conductor of each layer as the sum of its previously estimated vertical and horizontal capacitances (step 66).

Disk Accesses and Memory Requirements

With the databases sorted as described above, an RC extraction tool in accordance with the invention can estimate the horizontal capacitances of the conductors on a given layer L at step 59 from the information contained in tables TB(L−M) through TB(L+M) in an order that requires the tool to load each table into memory only once, that minimizes the number of tables of that must be concurrently stored in memory (thereby limiting the amount of memory needed), and that minimizes the number of times each entry of each table must be accessed to determine the position of a conductor described by that entry.

For example, when processing the database for layer L=7 the tool initially reads the table TB(7,1) for grid line 1 of layer 7 into memory and then accesses the table entry for the first conductor 22 to obtain the conductor's endpoint coordinates E1 and E2 and data, if any indicating its width. This information is sufficient for it to update the $M1^{(L,J)}(x,y)$ map for the up to N layers above layer 7 at step 48 and to update the $M2^{(I,L)}(x,y)$ maps for at step 57 for the up to N layers below layer 7.

At step 59, the tool determines the horizontal capacitance between conductor 22 and every conductor that horizontally overlaps conductor 22 and is no more than M grid lines away. Two layer L conductors on nearby grid lines "horizontally overlap" when any portion of them occupies similar positions along their respective grid lines. Conductors on the same layer that do not overlap are also considered to have negligible capacitance between them. Also the capacitance between two horizontally overlapping conductors is considered negligible when another conductor residing between them acts as a shield.

To locate all nearby, overlapping, non-shielded conductors on layer L that add to the capacitance of conductor 22, the RC extraction tool must first read the table for the next grid line 2 into memory and obtain the endpoint coordinates for the first conductor 24 from that table. Since their endpoint coordinates indicate conductors 22 and 24 are horizontally overlapping, the RC extraction tool can estimate the horizontal capacitance between them.

Since conductor 24 extends beyond conductor 22 in the X direction of the horizontal plane, the tool knows that no other horizontally overlapping conductors on grid lines 1–8 will capacitively couple to conductor 22 because conductor 24 shields conductor 22 from all such conductors. The tool therefore refrains from looking for overlapping conductors on lines 1–8 and instead reads the endpoint data for next conductor 23 and determines the horizontal capacitance between conductor 23 and it's nearby, horizontally overlapping neighbors. From the known endpoints of conductors 23 and 24, the tool determines conductor 24 overlaps conductor 23, so it computes the capacitance between conductors 23 and 24. Since conductor 24 also acts as a shield between conductor 23 and any conductors on grid lines 1–8, the tool knows that it has found all conductors that for which horizontal capacitance to conductor 23 must be calculated.

Since there are no more entries in the table for grid line 1, the tool can remove that table from memory and begin estimating horizontal capacitances between conductor 24 and its neighbors on any of grid lines 1–8. The tool first loads the table TB(7,3) for grid line 3 into memory, reads the endpoints of conductor 25 from that table and computes the capacitance between conductors 24 and 25. Since conductor 25 is the only entry in the table TB(7,3) for grid line 3, the tool next loads the table TB(7,4) for grid line 4 into memory and then determines from that table that no conductors reside on grid line 4. Since the distance between grid lines 3 and 5 is greater than M=2, the tool knows that it has computed all horizontal capacitances of conductor 24. Since the table TB(7,3) for grid line 3 contains no more entries, the tool can discard that table from memory after computing the horizontal capacitance for conductor 25. The RC extraction tool progresses in this manner from table-to-table computing the capacitance between each conductor along the grid line associated with each table and all nearby horizontally overlapping conductors residing on the M=2 highest-numbered grid lines. Note that the tool need not load a grid line table into memory more than once, and that it need not store more than three grid line tables in memory at any given time.

The method of determining conductor capacitances described above substantially reduces the number of times the RC extraction tool must read access a layout file without requiring the tool to retain a massive amount of information in memory at any given time. As described above, the tool does this in part by converting the IC layout file into a separate database for each layer of the IC, with each database including a separate table for each grid line, and with the table for each grid line being sorted according to the position of conductors along that grid line. This enables the tool to determine horizontal capacitances of conductors on any given layer without having to keep more than a few tables TB(L,G) in memory at any given time. Also presorting the tables reduces the number of times each entry of each table must be read accessed in order to calculate horizontal capacitances. Creating and holding M1 and M2 maps in memory allows the tool to process each database separately even though information in databases relating to several layers may be needed to estimates the vertical capacitance of a conductor on nay layer. The data structures implementing the maps for each layer are relatively small and do not require as much memory as the databases for each layer.

With the databases corresponding to layers being processed in the order in which the layers are stacked, the tool need concurrently store in memory M1 maps relating for at most only N layers above the layer currently being processed and M2 maps for to at most only N layers below the layer L who's database the tool is currently processing.

Partitioning

Figure 7:
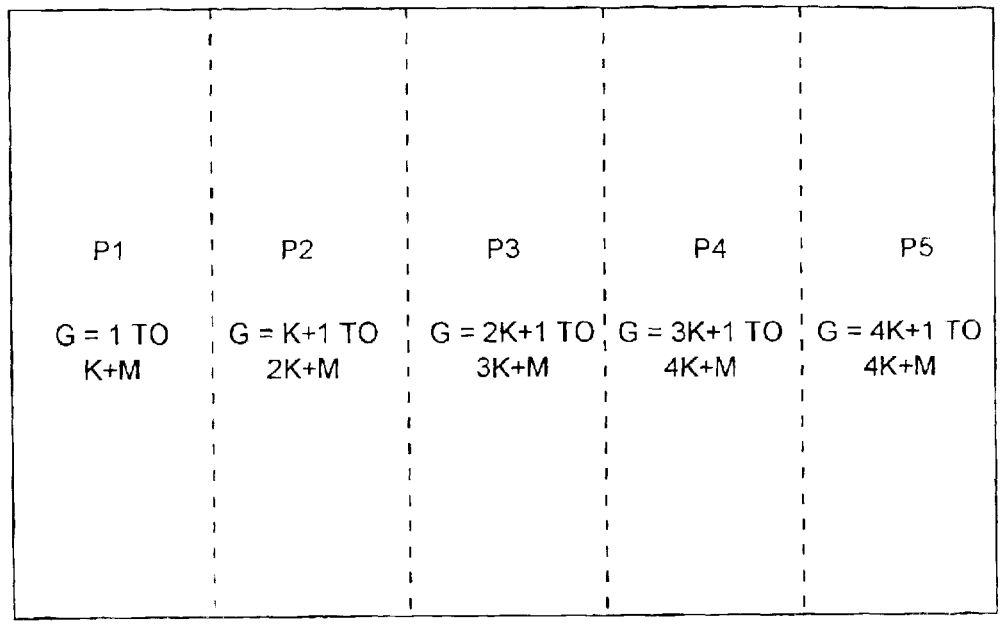
FIGS. 7 and 8 are simplified plan and sectional elevation views, respectively, of an IC illustrating how the IC layout may be partitioned prior to the RC extraction process.
Figure 8:
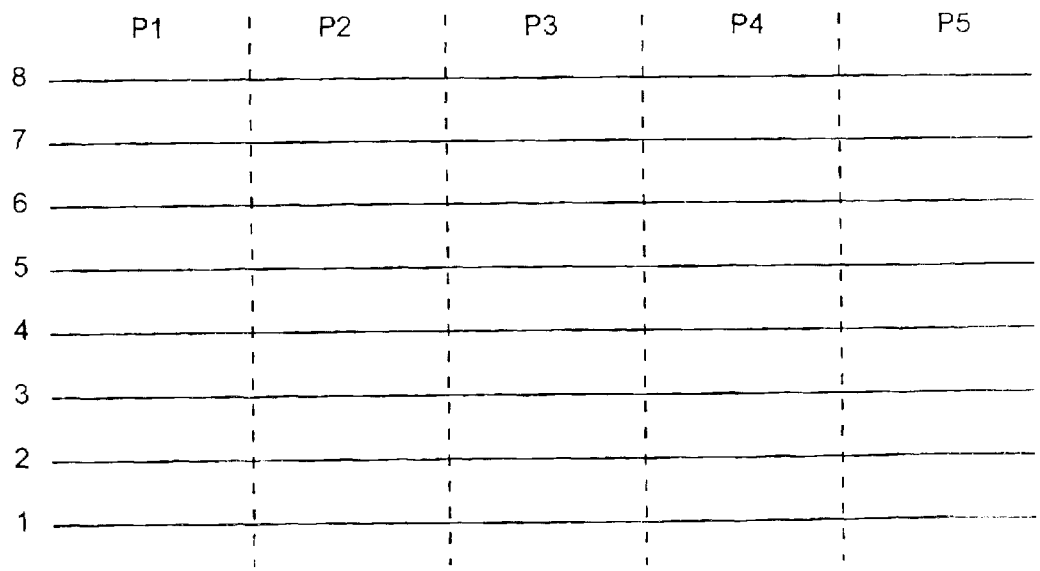

To minimize the number of disk assesses needed, the RC extraction tool should have enough random access memory to concurrently store up to N database tables, M1 maps for up to N layers above the layer currently being processed, and M2 maps for up to N layers below the layer currently being accessed. When the memory resources of an RC extraction tool are not sufficiently large, the tool can reduce its memory requirements by partitioning the IC layout. To do so, an RC extraction tool in accordance with the invention can divide a layout for a large IC into several overlapping partitions and then separately estimate the capacitance for each partition. FIG. 6 is a simplified plan view of an IC layout showing how the tool might divide the layout into five overlapping partitions P1–P5. Partition P1 includes conductors on grid lines 1 though K+M of the top layer, partition P2 includes conductors on grid lines K+1 through 2K+M of the top layer etc. FIG. 7 shows that the partitions extend through all eight IC layers of the IC. The tool creates a separate set of layer databases for each partition and treats each partition as a separate IC, estimating the vertical and horizontal capacitances of the conductor in each partition in the manner described above. For example, since partition P1 includes conductors on grid lines 1 through K+M, the databases for partition P1 will include enough information for the RC extraction tool to compute capacitances of all conductors on gridlines 1 though K of the top layer and of conductors on the layers below them. Since partition P2 includes conductors on grid lines K+1 through 2K+M, the databases for partition P2 will include enough information for the RC extraction tool to compute capacitances of all conductors on gridlines K+1 though 2K of the top layer and of conductors on the layers below them, provided that the tool processes the database for partition P1 first so that estimated horizontal capacitances of conductors on grid lines K+1 through K+M will be available when it processes partition P2.

When different RC extraction tools are to concurrently process the databases for each partition P1 and P2, then for example, partition P2 should span gridlines K+1−M though 2K+M so that the partition P2 databases will have all the information the RC extraction tool needs to process it will need to estimate capacitances on and below gridlines K+1 through 2K without requiring any information from the tool that processes partition P1 database. Similarly each partition P3–P5 should span an additional M grid lines to the left. The partitioning approach helps to further reduce the amount of data that the tool needs to keep in memory at any given time because it reduces the size of the database tables it must store in memory.

The foregoing specification and the drawings depict exemplary embodiments of a best mode of practicing the invention, and elements or steps of the depicted best mode exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiments of the invention depicted in the specification and drawings.

What is claimed is:

1. A method for estimating capacitances of conductors residing alone parallel arid lines on each of LMAX vertically stacked layers of an integrated circuit (IC), where LMAX is an integer greater than 1, based on data contained in a layout file describing each layer and indicating each conductor's dimensions and position along one of the grid lines on one of layers, the method comprising the steps of:

a. for each value of L from 1 to LMAX, processing the layout file to generate a separate database DB(L) comprising for each $G^{th}$ grid line on layer L a separate table TB(L,G) comprising for each conductor residing along that grid line a separate entry containing data indicating dimensions of that conductor and its position along that arid line; and, b. for each value of L from 1 to LMAX, processing tables TB(L,G) for all gridlines G of that layer L to generate a data structure $M1^{(L,J)}$ for each layer J=L+1 through L+N for which J<LMAX mapping layer J into an array of first rectangular areas and indicating an amount of surface area of conductors on layer L residing under each of the first rectangular areas, where N is an integer greater than 0.

2. The method in accordance with claim 1 further comprising the step of:

c. for each value of L from 1 to LMAX, processing tables TB(L,G) for all gridlines G of that layer L and ones of the data structures $M1^{(L,J)}$ generated at step b to generate a data structure $M2^{(I,L)}$ for each layer I=L−1 through L−N for which L−N<0, indicating an amount of area of conductors residing on layer L overlapping conductors on layer I residing in each of a plurality of arias of layer I.

3. The method in accordance with claim 2 further comprising the step of:

d. for each value of L from 1 to LMAX, estimating a vertical capacitance of each conductor on layer L based on the data contained in data structures $M1^{(L,J)}$ for all values of J from L+1 to L+N for which J is less than LMAX+1 and on the data contained in maps $M2^{(I,L)}$ for all values of I from L−N to L−1 for which I is greater than 0, where the vertical capacitance of each conductor is estimated as a sum of estimated capacitances between that conductor and other conductors residing on layers I and J.

4. The method in accordance with claim 3 further comprising the step of:

e. for each layer L from 1 to LMAX, estimating a horizontal capacitance of each conductor on layer L based on data contained in database DB(L), wherein the horizontal capacitance of each conductor is estimated as a sum of estimated capacitances between that conductor and other conductors residing on the same layer.

5. The method in accordance with claim 3 wherein each of steps b and c are executed with respect to each layer L other than layer LMAX before they are executed for layer L+1.

6. The method in accordance with claim 3 wherein each of steps a, b, and c are executed for each layer L other than layer LMAX before they are executed for layer L+1.

7. The method in accordance with claim 4 wherein each of steps b, c and e are executed for each layer L other than layer LMAX before they are executed for layer L+1.

8. The method in accordance with claim 4, wherein each of steps a, b, c and e are executed for each layer L other than layer LMAX before they are executed for layer L+1.

9. The method in accordance with claim 6 wherein step e comprises the substeps of:

e1. for each value of L from 1 to LMAX, read accessing the tables of database DB(L) in an order in which their corresponding grid lines are arranged on layer L, and reading accessing entries in each accessed table in an order in which their corresponding conductors reside on the grid line, to obtained the data contained in those entire;

e2. for each value of L from 1 to LMAX, selecting pairs of conductors based on their proximity and respective positions on layer L as indicated by the data obtained at step e1, estimating a capacitance between each selected pair of conductors as a function of the data obtained at step e1 from their corresponding entries; and e3. for each value of L from 1 to LMAX, estimating the horizontal capacitance of each conductor as a sum of estimated capacitances between all selected pairs including that conductor as a member.

10. The method in accordance with claim 9 wherein each pair of conductors are selected when they are within a predetermined number of grid lines apart, they occupy at least partially horizontally overlapping positions on their respective grid lines, and no other conductor resides between them.

11. The method of claim 9 wherein all of steps e1–e3 are executed for each layer L from 1 to LMAX−1 before they are executed for layer L+1.

12. Computer-readable media storing software which when read and executed by a computer causes the computer to execute a method for estimating capacitances of conductors residing along parallel arid lines on each of LMAX vertically stacked layers of an integrated circuit (IC), where LMAX is an integer greater than 1, based on data contained in a la out file describing each layer and indicating each conductor's dimensions and position along one of the grid lines on one of layers, wherein the method comprises the steps of:

a. for each value of L from 1 to LMAX, processing the layout file to generate a separate database DB(L) comprising for each $G^{th}$ grid line on layer L a separate table TB(L,G) comprising for each conductor residing along that arid line a separate entry containing data indicating dimensions of that conductor and its position along that grid line; and, b. for each value of L from 1 to LMAX, processing tables TB(L,G) for all gridlines G of that layer L to generate a data structure $M1^{(L,J)}$ for each layer J=L+1 through L+N for which J<LMAX mapping layer J into an array of first rectangular areas and indicating an amount of surface area of conductors on layer L residing under each of the first rectangular areas, where N is an integer greater than 0.

13. The computer-readable media in accordance with claim 12 wherein the method further comprises the step of:

c. for each value of L from 1 to LMAX, processing tables TB(L,G) for all gridlines G of that layer L and ones of the data structures $M1^{(L,J)}$ generated at step b to generate a data structure $M2^{(I,L)}$ for each layer I=L−1 through L−N for which L−N<0, indicating an amount of area of conductors residing on layer L overlapping conductors on layer I residing in each of a plurality of arias of layer I.

14. The computer-readable media in accordance with 13 wherein the method further comprises the step of:

d. for each value of L from 1 to LMAX, estimating a vertical capacitance of each conductor on layer L based on the data contained in data structures M1$^{(L,J)}$ for all values of J from L+1 to L+N for which J is less than LMAX+1 and on the data contained in maps M2$^{(I,L)}$ for all values of I from L−N to L−1 for which I is greater than 0, where the vertical capacitance of each conductor is estimated as a sum of estimated capacitances between that conductor and other conductors residing on layers I and J.

15. The computer-readable media in accordance with claim 14 wherein the method further comprises the step of:
e. for each layer L from 1 to LMAX, estimating a horizontal capacitance of each conductor on layer L based on data contained in database DB(L), wherein the horizontal capacitance of each conductor is estimated as a sum of estimated capacitances between that conductor and other conductors residing on the same layer.

16. The computer-readable media in accordance with claim 14 wherein each of steps b and c are executed with respect to each layer L other than layer LMAX before they are executed for layer L+1.

17. The computer-readable media in accordance with claim 14 wherein each of steps a, b, and c are executed for each layer L other than layer LMAX before they are executed for layer L+1.

18. The computer-readable media in accordance with claim 15 wherein each of steps b, c and e are executed for each layer L other than layer LMAX before they are executed for layer L+1.

19. The computer-readable media in accordance with claim 15, wherein each of steps a, b, c and e are executed for each layer L other than layer LMAX before they are executed for layer L+1.

20. The computer-readable media in accordance with claim 19 wherein step e comprises the substeps of:
e1. for each value of L from 1 to LMAX, read accessing the tables of database DB(L) in an order in which their corresponding grid lines are arranged on layer L, and reading accessing entries in each accessed table in an order in which their corresponding conductors reside on the grid line, to obtained the data contained in those entire;
e2. for each value of L from 1 to LMAX, selecting pairs of conductors based on their proximity and respective positions on layer L as indicated by the data obtained at step e1, estimating a capacitance between each selected pair of conductors as a function of the data obtained at step e1 from their corresponding entries; and
e3. for each value of L from 1 to LMAX, estimating the horizontal capacitance of each conductor as a sum of estimated capacitances between all selected pairs including that conductor as a member.

21. The computer-readable media in accordance with claim 20 wherein each pair of conductors are selected when they are within a predetermined number of grid lines apart, they occupy at least partially horizontally overlapping positions on their respective grid lines, and no other conductor resides between them.

22. The computer-readable media of claim 20 wherein all of steps e1–e3 are executed for each layer L from 1 to LMAX−1 before they are executed for layer L+1.

23. Computer-readable media storing software which when read and executed by a computer causes the computer to execute a method for estimating capacitances of conductors residing along parallel grid lines on each of LMAX vertically stacked layers of an integrated circuit (IC), where LMAX is an integer greater than 1, based on data contained in a layout file describing each layer and indicating each conductor's dimensions and position along one of the grid lines on one of layers, the method comprising the steps of:
a. identifying a plurality of partially overlapping partitions of the IC, each spanning a separate horizontal area of the IC;
b. for each partition, processing the layout file to generate a separate database DB(L) for each value of L from 1 to LMAX wherein database DB(L) comprise for each G$^{th}$ grid line on a portion of layer L residing within that partition a separate table TB(L,G) comprising for each conductor residing along that grid line a separate entry containing data indicating dimensions of that conductor and its position along that arid line: and,
c. for each partition, processing tables TB(L,G) for all gridlines G of each layer L, for each value of L from 1 to LMAX, to generate a data structure M1$^{(L,J)}$ for each layer J=L+1 through L+N for which J<LMAX mapping layer J into an array of first rectangular areas and indicating an amount of surface area of conductors on layer L residing under each of the first rectangular areas, where N is an integer greater than 0.

24. The computer-readable media in accordance with claim 23 further comprising the step of:
d. for each partition, processing tables TB(L,G) for all gridlines G of each layer L for each value of L from 1 to LMAX, and processing ones of the data structures M1$^{(L,J)}$ generated at step b to generate a data structure M2$^{(I,L)}$ for each layer I=L−1 through L−N for which L−N<0, indicating an amount of area of conductors residing on layer L overlapping conductors on layer I residing in each of a plurality of arias of layer I.

25. The computer-readable media in accordance with claim 24 further comprising the step of:
e. for each partition, estimating a vertical capacitance of each conductor on each layer L for each value of L from 1 to LMAX, based on the data contained in data structures M1$^{(L,J)}$ for all values of J from L+1 to L+N for which J is less than LMAX+1 and on the data contained in maps M2$^{(I,L)}$ for all values of I from L−N to L−1 for which I is greater than 0, where the vertical capacitance of each conductor is estimated as a sum of estimated capacitances between that conductor and other conductors residing on layers I and J.

26. The computer-readable media in accordance with claim 25 further comprising the step of:
f. for each partition, estimating a horizontal capacitance of each conductor on each layer layer L from 1 to LMAX, based on data contained in database DB(L), wherein the horizontal capacitance of each conductor is estimated as a sum of estimated capacitances between that conductor and other conductors residing on the same layer.

* * * * *